United States Patent [19]

Tanaka et al.

[11] 4,277,759
[45] Jul. 7, 1981

[54] SEMICONDUCTOR LASER DEVICE

[75] Inventors: Toshio Tanaka; Hirofumi Namizaki; Saburo Takamiya; Wataru Susaki, all of Itami, Japan

[73] Assignee: Mitsubishi Denki Kabushiki Kaisha, Tokyo, Japan

[21] Appl. No.: 40,085

[22] Filed: May 17, 1979

[30] Foreign Application Priority Data

Jul. 10, 1978 [JP] Japan .................. 53-84408

[51] Int. Cl.$^3$ ............................... H01S 3/19
[52] U.S. Cl. .................... 331/94.5 H; 357/17
[58] Field of Search ............. 331/94.5 H; 357/17, 357/18

[56] References Cited

U.S. PATENT DOCUMENTS

| 3,990,096 | 11/1976 | Namizaki et al. | 357/18 |
| 4,166,278 | 8/1979 | Susaki et al. | 357/18 |
| 4,183,038 | 1/1980 | Namizaki et al. | 357/17 |

OTHER PUBLICATIONS

Kumabe et al., "High Temperature Single–Mode CW Operation with a Junction–Up TJS Laser", *Appl. Phys. Lett.* 33(1), Jul. 1, 1978, pp. 38–39.
Namizaki, "Transverse–Junction–Stripe Lasers with a GaAS p-n Homojunction", IEEE J. of Quantum Electronics, vol. QE-11, No. 7, Jul. 1975, pp. 427–431.

*Primary Examiner*—James W. Davie
*Attorney, Agent, or Firm*—Wenderoth, Lind & Ponack

[57] ABSTRACT

A first N-AlGaAs and a second N-GaAs layer are successively grown on an I-GaAs substrate. A third N-AlGaAs, a fourth P-AlGaAs and a fifth N-GaAs layer superpose one another on the second layer except for one lateral portion. Those portions of the five layers remote from the exposed second layer portion are changed into a P$^+$ type and surrounded by a P zone. A positive and a negative electrode are located on the fifth layer and the exposed second layer portion respectively. The negative electrode is nearest to a laser region located in the second layer and can be secured to a heat sink.

20 Claims, 4 Drawing Figures

SEMICONDUCTOR LASER DEVICE

BACKGROUND OF THE INVENTION

This invention relates to semiconductor laser devices, and more particularly to improvements in a transverse junction stripe (which is abbreviated hereinafter to "TJS") type semiconductor laser device.

In semiconductor laser device, it is desirable to decrease the threshold current at which the laser oscillation is caused and there are already several known structures of a semiconductor laser device having decreased threshold currents. Among them, TJS type semiconductor laser devices have the particularly excellent structure by which a single mode oscillation is generated.

One of the known types of TJS semiconductor laser devices has comprised a substrate of gallium arsenide (GaAs) having a high resistivity and four semiconductor layers disposed in a superposed relationship on the substrate. Those four semiconductor layers have included aluminum gallium arsenide (AlGaAs) layers alternating gallium arsenide (GaAs) layers with the outermost layer formed of gallium arsenide. The four semiconductor layers have included one half having a P+ conductivity and the other half having an N type conductivity with a P type semiconductor zone interposed therebetween. By removing that portion of the P type semiconductor zone located in the outermost semiconductor layer, a groove has been formed to space the outermost layer into a P+ type and an N type layer portion, and a positive and a negative electrode have been disposed in ohmic contact with the P+ and N type layer portions respectively.

With a voltage applied across the positive and negative electrodes to render the former positive with respect to the latter, the greater part of the resulting current is concentrated into a PN junction adjacent to an activated layer region formed of that portion of the P type semiconductor zone located in the gallium arsenide layer nearer to the substrate resulting in the generation of a laser oscillation in that region.

When the semiconductor laser device as above described is disposed upside down on a heat sink, the groove formed in the outermost layer creates a void between the device and the heat sink with the result that this void prevents heat generated in the activated laser region from dissipating in the heat sink. This has given rise to problems in that the threshold current is not only increased but also the characteristics of the device are prematurely deteriorated.

Accordingly, it is an object of the present invention to provide a new and improved semiconductor laser device having a structure by which a surface portion of the device located in closest vicinity to an activated laser region involved can directly contact an associated heat sink to improve its heat dissipation and to thereby decrease the threshold current and increase the device lifetime as well as effecting a laser oscillation at a low threshold current, even at relatively high ambient temperatures.

SUMMARY OF THE INVENTION

The present invention provides a semiconductor laser device comprising a substrate of semiconductive material having a high resistivity and including a main face, and a multi-layer structure formed by growing successively a first semiconductor layer of a first type conductivity, a second semiconductor layer of the first type conductivity, a third semiconductor layer of the first type conductivity, a fourth semiconductor layer of a second type conductivity and a fifth semiconductor layer of the first type conductivity on the main face of the semiconductor substrate. The second semiconductor layer is formed of a semiconductive material narrower in forbidden band-width than that of the first semiconductor layer and the third semiconductor layer is formed of a semiconductive material broader in forbidden band-width than that of the second semiconductor layer. A semiconductor region of the second type conductivity is formed in one lateral portion of the multi-layer structure to extend in the entire surface portion of the fifth semiconductor layer and reach the semiconductor substrate thereby to form PN junctions in the first, second, third and fifth semiconductor layers respectively. Then those portions of the fifth, fourth and third semiconductor layers located in the other lateral portion of the semiconductor substrate are removed to expose that portion of the second semiconductor layer disposed in the other lateral portion of the multilayer structure. A first electrode is disposed in ohmic contact with the exposed surface portion of the second semiconductor layer and a second electrode is disposed in ohmic contact with the remaining portion of the fifth semiconductor layer.

In a preferred embodiment of the present invention, the semiconductor substrate is composed of gallium arsenide having a resistivity of at least $10^4$ ohms centimeter while the first, third and fourth semiconductor layers are formed of aluminum gallium arsenide (AlGaAs) and the second and fifth semiconductor layers are formed of gallium arsenide (GaAs).

The semiconductor laser device can be disposed on a heat sink by having the first and second electrodes fixedly secured to the surface of the heat sink complementary in configuration to the surface of the device provided with both electrodes.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENT

Figure 1:
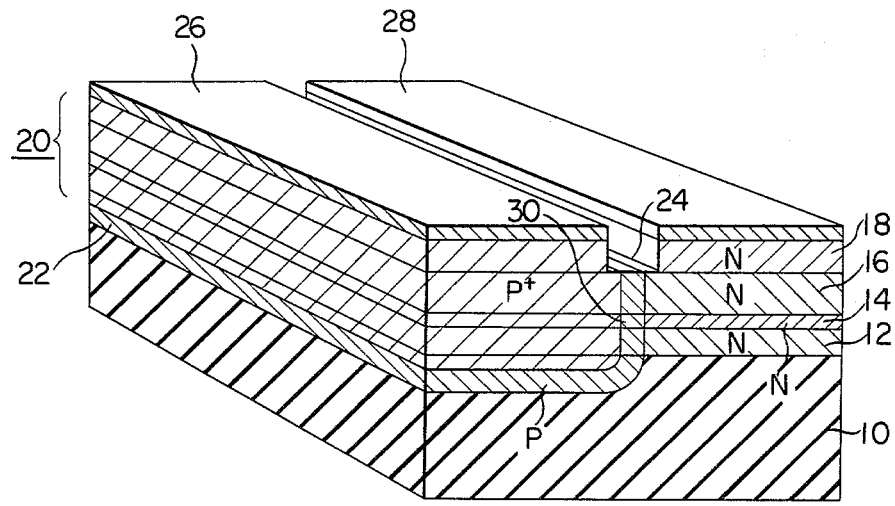
FIG. 1 is a fragmental perspective view of a conventional TJS type semiconductor laser device.

Referring now to FIG. 1 of the drawings, there is illustrated the fundamental structure of a conventional TJS type semiconductor laser device. The arrangement illustrated comprises a substrate 10 of semiconductive material, in this case, I type gallium arsenide (GaAs) having a high resistivity of at least $10^4$ ohms centimeter, and an N type aluminum gallium arsenide (AlGaAs) layer 12, an activated layer 14 of N type gallium arsenide (GaAs), an N type aluminum gallium arsenide (AlGaAs) layer 16 and a contact layer 18 of N type gallium arsenide successively grown on one of the main opposite faces, (in this case, the upper main face as viewed in FIG. 1 of the substrate 10), by a liquid phase epitaxial growth technique.

Then, zinc (Zn) is highly doped into one half, in the example illustrated, a left half as viewed in FIG. 1 of the superposed grown layers 12, 14, 16 and 18 from the surface of the uppermost layer layer 18 by a selective diffusion technique to form therein a P type semiconductor region generally designated by the reference numeral 20. The P+ type region 20 reaches that portion of the substrate 10 adjacent to the highly doped portion of the layer 12. Subsequently, by subjecting the substrate 10 and the superposed layers 12, 14, 16 and 18 thus processed to a heat treatment, the zinc included in the P+ type semiconductor region 20 is drive-diffused into the adjacent portions of the gallium arsenide substrate 10, the N type aluminum gallium arsenide layer 12, the activated N type gallium arsenide layer 14, the N type aluminum gallium arsenide layer 16 and the contact N type aluminum gallium arsenide layer 18 to form a P type semiconductor zone 22 with a substantially uniform thickness at the bottom and on the lefthand side as viewed in FIG. 1 of the P+ type semiconductor region 20. Thus PN junctions are formed in the first, second, third and fourth semiconductor layers 12, 14, 16 and 18 respectively.

In order to space the P+ type portion of the contact layer 18 from the N type portion thereof, the P type portion and the adjacent portion of the contact layer 18 is chemically etched away to form a groove 24, located between the P+ and N type portions thereof and somewhat wider than the P type zone 22.

Then a positive electrode 26 is disposed in ohmic contact with the P+ type portion of the contact gallium arsenide layer 18 to be coextensive with the latter while a negative electrode 28 is disposed in ohmic contact with the N type portion of the contact layer 18 to be coextensive with the latter.

As well known, gallium arsenide (GaAs) is narrower in forbidden band-width than aluminum gallium arsenide (AlGaAs). Accordingly, a diffusion potential at the PN junction formed in the activated gallium arsenide (GaAs) layer 14 can be less than that at the PN junction formed in each of the aluminum gallium arsenide (AlGaAs) layers 12 and 16. When a voltage is applied across the positive and negative electrodes 26 and 28 respectively to render the electrode 26 positive with respect to the electrode 28, the greater part of the resulting current is concentrated in the PN junction formed in the activated gallium arsenide (GaAs) layer 14 because the gallium arsenide (GaAs) substrate 10 has a high resistivity of $10^4$ ohms centimeter or higher. As a result, a laser oscillation is caused in an activated P type gallium arsenide region 30 formed of the P type portion of the activiated layer 14.

Figure 2:
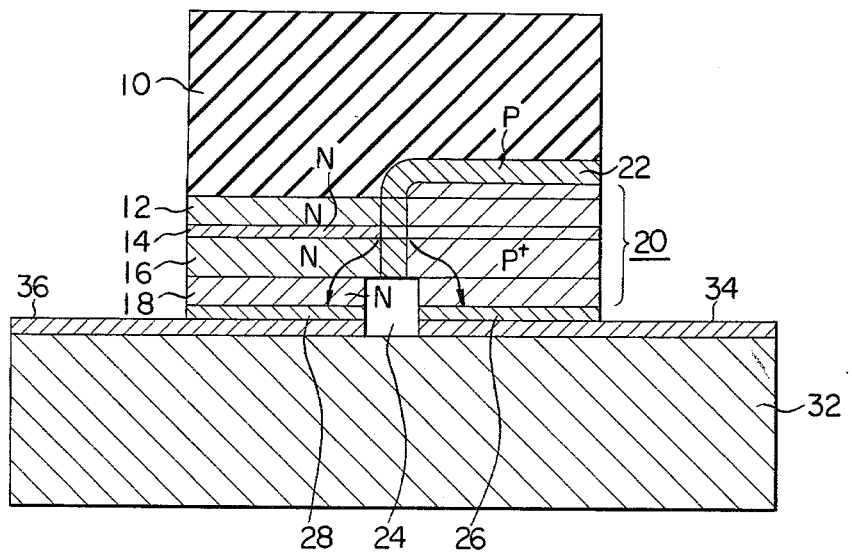
FIG. 2 is a longitudinal sectional view of the arrangement shown in FIG. 1 and disposed upside down on a heat sink.

The arrangement illustrated in FIG. 1 can be disposed upside down on a heat sink as shown in FIG. 2. As shown in FIG. 2, the positive and negative electrodes 26 and 28 are respectively bonded on a heat sink 32 through respective bonding pads 32 and 34. The pads 34 and 36 also serve as electric conductors through which the arrangement is connected across an associated electric source (not shown). The heat sink 32 may be formed of a material approximating in thermal expansion the material forming the particular semiconductor laser device and having a good thermal conductivity. For example, the heat sink 32 may be formed of a silicon substrate.

Conventional TJS type semiconductor laser devices such as shown in FIG. 1 include the groove 24 serving to space the P+ type region away from the N type region of the contact gallium arsenide (GaAs). That groove 24, therefore, forms a void between the contact layer 18 and the heat sink 32, as shown in FIG. 2, to impede heat generated in the activated region 30, (formed of P type gallium arsenide), from dissipating into the heat sink 32. In other words, this heat is forced to dissipate into the heat sink 32 through a roundabout path as shown by the arrows in FIG. 2 because of the presence of the groove 24. The presence of the groove 24 has caused problems in that the threshold current through the devices is not only increased but also the characteristics are prematurely deteriorated due to the generation of heat as described above.

The present invention solves the above-noted problems.

Figure 3:
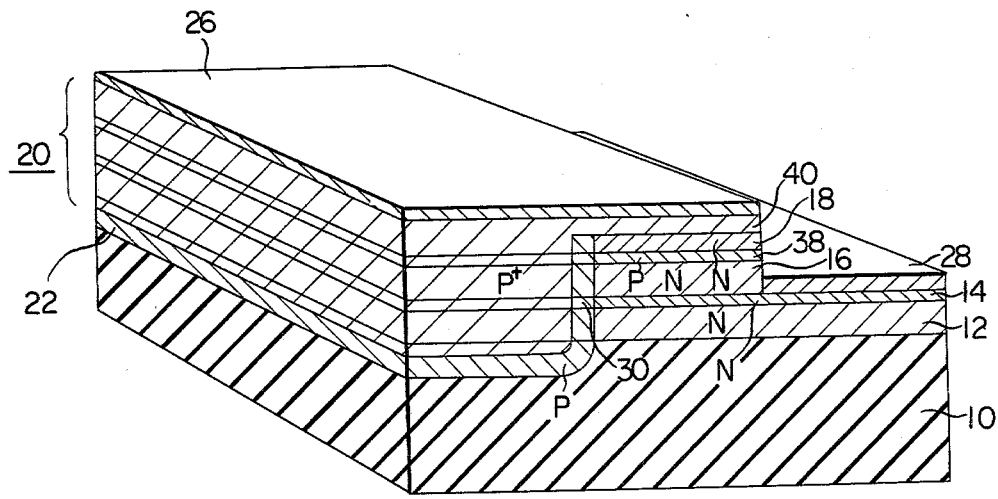
FIG. 3 is a fragmental view of an embodiment according to the TJS type semiconductor laser device of the present invention.

Referring now to FIG. 3, wherein like reference numerals designate the components identical or corresponding to those shown in FIG. 1, there is illustrated a TJS type semiconductor laser device according to the present invention. In order to produce the device illustrated, a liquid phase epitaxial growth technique is first utilized to successively grow an N type aluminum gallium arsenide (AlGaAs) layer 12, an activated N type gallium arsenide layer 14, an N type aluminum gallium arsenide (AlGaAs) layer 16, a P type aluminum gallium arsenide (AlGaAs) layer 38, and a contact N type gallium arsenide (GaAs) layer 18 on one of the main faces, in this case, an upper main face of a substrate 10 of a high resistivity semiconductive material, (for example, I type gallium arsenide (GaAs) having a resistivity of at least $10^4$ ohms centimeter). Thus a multilayer structure is formed on the semiconductor substrate 10.

The N type layer 12 forms a first semiconductor layer of a first type conductivity and the N type layer 14 forms a second semiconductor layer of the first type conductivity narrower in forbideen band-width than that of the first semiconductor layer 12. The N type layer 16 forms a third semiconductor layer of the first type conductivity broader in forbidden band-width than that of the second semiconductor layer, the P type layer 38 forms a fourth semiconductor layer of a second type conductivity, and the N type layer 18 forms a fifth semiconductor layer of the first type conductivity.

As in the arrangement of FIG. 1, zinc (Zn) is highly doped into the assembly thus produced by a selective diffusion technique to form a P+ type semiconductor region 20 reaching the substrate 10 in one lateral portion of the multi-layer structure. In this illustrated example the P+ type semiconductor region 20 is formed in about one third of the superposed grown layers or the multilayer structure and in the adjacent portion of the substrate on the lefthand side as viewed in FIG. 3 for the purpose as will be apparent hereinafter. Following this, the P type semiconductor zone 22 is formed to run along the bottom and righthand side as viewed in FIG. 3 of the P+ type semiconductor region 20 by a heat treatment as in the arrangement of FIG. 1.

Subsequently zinc (Zn) is diffused into the entire surface portion of the contact N type semiconductor layer 18 to form a P+ type diffusion layer 40 occupying an upper half (as viewed in FIG. 3) of the contact layer 18. As a result, PN junctions are formed in the first, second and third semiconductor layers 12, 14 and 16 and in the lower half (as viewed in FIG. 3) of the fifth semiconductor layer 18.

Then, the other lateral portion of the multi-layer structure opposite to the P+ type semiconductor region 20 is selectively etched away with any suitable etching solution to remove those portions of the fifth, fourth and third layers 18, 38 and 16 occupying the other lateral portion of the multi-layer structure. This results in the exposure of that portion of the second layer 14 overlaid with the removed layer portions. The etching solution is required to etch away both gallium arsenide (GaAs) and aluminum gallium arsenide (AlGaAs) and may comprise hydrogen fluoride (HF) or a mixed solution of ammonium hydroxide (NH$_4$OH) and hydrogen peroxide (H$_2$O$_2$).

Thereafter, the positive electrode 26 is disposed in ohmic contact with the surface of that portion of the P+ type diffusion layer 36 left without etching while the negative electrode 28 is disposed in ohmic contact with the exposed surface portion of the N type second or activated layer 14.

It is to be noted that the proportion of the P+ type semiconductor region 20 or the removed layer portions may be determined at will.

The arrangement of FIG. 3 includes a PNPN structure formed below the positive electrode 26 except for both P+ type semiconductor region 20 and the P type semiconductor zone 22 because of the presence of the P type aluminum gallium arsenide (AlGaAs) layer 38 and the P+ type diffusion layer 40. Therefore, when a voltage is applied across the electrodes 26 and 28 to render the electrode 26 positive with respect to the electrode 28, a PN junction formed between the P type layer 38 and the N type contact layer 18 is reverse biased to cause the resulting current from the positive electrode 26 to concentrate in the activated gallium arsenide (GaAs) layer 14 through the P+ type semiconductor region 20 and then to flow into the negative electrode 28. This results in the occurrence of a laser oscillation in the activated layer region 30 formed of that portion of the P type semiconductor zone 22 disposed in the activated semiconductor layer 14.

Figure 4:
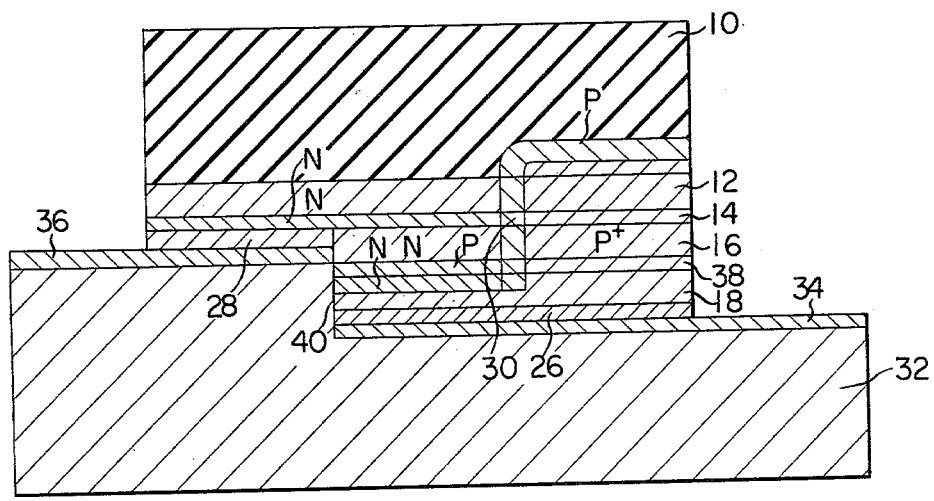
FIG. 4 is a view similar to FIG. 2 but illustrating the arrangement shown in FIG. 3.

The arrangement of FIG. 3 can be disposed upside down on a heat sink as shown in FIG. 4. To this end, the heat sink 32 includes a stepped surface complementary in configuration to the upper surface of the arrangement as viewed in FIG. 3 provided with the electrodes 26 and 28. Therefore the electrode 26 is fixedly secured to the lower surface portion as viewed in FIG. 4 of the heat sink 32 through a bonding pad 34 while the electrode 28 is fixedly secured to the upper surface portion thereof through another bonding layer 36.

As in the arrangement of FIG. 2, the bonding layers 34 and 36 also serve as electric conductors for connecting the arrangement of FIG. 3 across an associated electric source (not shown). Also the heat sink 32 is preferably of a silicon substrate.

As described above, the arrangement shown in FIG. 3 includes the P type aluminum gallium arsenide layer 38 and the P+ type diffusion layer 40 and the PN junction between the P type layer 38 and the N type contact layer 18 is reverse biased in operation therefore the positive electrode 26 is permitted to be disposed in ohmic contact with the surface portion of the contact layer 18 below which the activated laser region 30 is located. This is because the reverse biased PN junction between the layers 38 and 18 is operated to prevent any unavailable current from flowing through the PNPN structure as described above. As a result, the normal laser oscillation occurs in the activated laser region 30 without the necessity of providing the groove which has been previously required.

This is attended with the advantage that the arrangement of FIG. 4 can effectively dissipate heat generated in the activated laser region 30 because the heat from the region 30 can be directly transmitted to the heat sink 32 through a solid portion without passing through the void required for the prior art practice.

From the foregoing it is seen that, according to the present invention, the semiconductor laser device includes a fourth semiconductor layer of a second type conductivity which causes a current to concentrate in a second semiconductor layer through a semiconductor region of the second type conductivity although a positive electrode is located above an activated laser region disposed in the second semiconductor layer. Then the current flows into a negative electrode disposed in ohmic contact with the second semiconductor layer. Therefore that portion of the device located in close vicinity of the activated laser region can be directly fixed to an associated heat sink through the negative electrode resulting in the realization of a semiconductor laser device good in heat dissipation.

While the present invention has been illustrated and described in conjunction with a single preferred embodiment thereof, it is to be understood that numerous changes and modifications may be resorted to without departing from the spirit and scope of the present invention. For example, the present invention is not restricted to semiconductor laser devices employings the gallium arsenide (GaAs) crystal and aluminum gallium arsenide (AlGaAs) crystal and the same is equally applicable to a variety of semiconductor laser devices using other semiconductive materials having different forbidden band-widths. Also, the respective semiconductor portions may have the conductivity reversed from that illustrated with the polarity of the electrodes changed accordingly.

What we claim is:

1. In a semiconductor laser device, the combination comprising: a substrate of semiconductive material having a high resistivity and including one main face, a first semiconductor layer of a first type conductivity, a second semiconductor layer of said first type conductivity, a third semiconductor layer of said first type conductivity, a fourth semiconductor layer of a second type conductivity and a fifth semiconductor layer of said first type conductivity successively grown on said main face of said substrate to form a multi-layer structure thereon, said second layer being formed of a semiconductive material narrower in forbidden band-width than that of said first semiconductor layer, said third layer being formed of a semiconductive material broader in forbidden band-width than that of said second semiconductor layer, a semiconductor region of said second type conductivity disposed on the surface portion of said fifth semiconductor layer and in one lateral portion of said multi-layer structure to extend from the surface of said fifth semiconductor layer and reach said substrate thereby to form PN junctions in said first, second, third and fifth semiconductor layers respectively, said second semiconductor layer of said first type conductivity including an exposed surface portion on the other lateral portion of said multi-layer structure formed by removing those portions of said fifth, fourth and third semiconductor layers located in said other lateral portion of said multi-layer structure, a first electrode disposed in ohmic contact with said exposed surface portion of said second semiconductor layer, and a second electrode disposed in ohmic contact with the remaining portion of said surface of said fifth semiconductor layer.

2. In a semiconductor laser device as claimed in claim 1, the combination wherein said semiconductor substrate is formed of gallium arsenide (GaAs) having a resistivity of at least $10^4$ ohm centimeter, said first, third and fourth semiconductor layers are formed of aluminum gallium arsenide (AlGaAs), and said second and fifth semiconductor layers are formed of gallium arsenide (GaAs).

3. In a semiconductor laser device as claimed in claim 2, the combination wherein a selected one of hydrogen fluoride (HF) and a mixed solution of ammonium hydroxide ($NH_4OH$) and hydrogen peroxide ($H_2O_2$) is used to selectively etch away those portions of said fifth, fourth and third semiconductor layers located in the other lateral portion of said multi-layer structure.

4. In a semiconductor laser device as claimed in any of claims 1 through 3, the combination wherein said first, second, third, fourth and fifth semiconductor layers are successively disposed on said main face of said semiconductor substrate according to a liquid phase growth technique.

5. In a semiconductor laser device as claimed in any of claims 1 through 3, the combination wherein said semiconductor region of said second type conductivity is formed through the selective diffusion of zinc (Zn).

6. In a semiconductor laser device as claimed in any of claims 1 through 3, the combination wherein said first type conductivity is of an N type and said second type conductivity of a P type.

7. In semiconductor laser device as claimed in claim 6, the combination wherein a voltage is applied across said first and second electrodes so as to render said second electrode positive with respect to said first electrode.

8. In a semiconductor laser device as claimed in any of claims 1 through 3, the combination wherein said first type conductivity of a P type and said second type conductivity is of an N type.

9. In a semiconductor laser device as claimed in claim 4, the combination wherein said semiconductor region of said second type conductivity is formed through the selective diffusion of zinc (Zn).

10. In a semiconductor laser device as claimed in claim 4, the combination wherein said first type conductivity is of an N type and said second type conductivity of a P type.

11. In a semiconductor laser device as claimed in claim 5, the combination wherein said first type conductivity is of an N type and said second type conductivity of a P type.

12. In semiconductor laser device as claimed in claim 10, the combination wherein a voltage is applied across said first and second electrodes so as to render said second electrode positive with respect to said first electrode.

13. In semiconductor laser device as claimed in claim 11, the combination wherein a voltage is applied across said first and second electrodes so as to render said second electrode positive with respect to said first electrode.

14. In a semiconductor laser device as claimed in claim 4, the combination wherein said first type conductivity of a P type and said second type conductivity is of an N type.

15. In a semiconductor laser device as claimed in claim 5, the combination wherein said first type conductivity of a P type and said second type conductivity is of an N type.

16. In a semiconductor laser device, the combination comprising: a substrate of semiconductive material having a high resistivity and including one main face, a first semiconductor layer of a first type conductivity, a second semiconductor layer of said first type conductivity, a third semiconductor layer of said first type conductivity, a fourth semiconductor layer of a second type conductivity and a fifth semiconductor layer of said first type conductivity successively grown on said one main face of said substrate to form a multi-layer structure thereon, said second layer being formed of a semiconductive material narrower in forbidden band-width than that of said first semiconductor layer, said third layer being formed of a semiconductive material broader in forbidden band-width than that of said second semiconductor layer, a semiconductor region of said second type conductivity disposed on the surface portion of said fifth semiconductor layer and in one lateral portion of said multi-layer structure to extend from the surface of said fifth semiconductor layer and reach said substrate, thereby to form PN junctions in said first, second, third and fifth semiconductor layers respectively, said second semiconductor layer of said first type conductivity including an exposed surface portion on the other lateral portion of said multi-layer structure formed by removing those portions of said fifth, fourth and third semiconductor layers located in said other lateral portion of said multi-layer structure, a first electrode disposed in ohmic contact with said exposed surface portion of said second semiconductor layer, a second electrode disposed in ohmic contact with the remaining portion of said surface of said fifth semiconductor layer, and a heat sink disposed adjacent to said second electrode.

17. In a semiconductor laser device as claimed in claim 16, the combination wherein said heat sink includes a surface complementary in configuration to the surface of said device provided with first and second electrode.

18. In a semiconductor laser device as claimed in claims 16 or 17, the combination wherein said heat sink is composed of a silicon substrate.

19. In a semiconductor laser device as claimed in claims 16 or 17, the combination wherein an electric conductor is disposed on said heat sink to contact each of said first and second electrodes.

20. In a semiconductor laser device as claimed in claim 11, the combination wherein an electric conductor is disposed on said heat sink to contact each of said first and second electrodes.

* * * * *